(12) United States Patent
Altaii et al.

(10) Patent No.: US 8,692,173 B2
(45) Date of Patent: Apr. 8, 2014

(54) SOLAR TRACKING SENSOR ARRAY

(76) Inventors: Karim Altaii, Harrisonburg, VA (US); Benjamin Thomas, Powhatan, VA (US)

( * ) Notice: Subject to any disclaimer, the term of this patent is extended or adjusted under 35 U.S.C. 154(b) by 387 days.

(21) Appl. No.: 12/583,469

(22) Filed: Aug. 22, 2009

(65) Prior Publication Data
US 2009/0314279 A1 Dec. 24, 2009

Related U.S. Application Data

(62) Division of application No. 11/236,695, filed on Sep. 27, 2005, now Pat. No. 7,692,091.

(51) Int. Cl.
| | |
|---|---|
| *F24J 2/38* | (2014.01) |
| *H01L 25/00* | (2006.01) |
| *H01L 31/00* | (2006.01) |
| *H02N 6/00* | (2006.01) |
| *H01L 31/042* | (2014.01) |
| *G01C 21/02* | (2006.01) |
| *G01C 21/24* | (2006.01) |
| *G01J 1/20* | (2006.01) |

(52) U.S. Cl.
USPC .......... 250/203.4; 136/243; 136/246; 126/573

(58) Field of Classification Search
USPC .......... 136/243, 246, 251, 259, 293; 126/573; 250/203.4
See application file for complete search history.

(56) References Cited

U.S. PATENT DOCUMENTS

| | | | | |
|---|---|---|---|---|
| 4,146,785 | A | * | 3/1979 | Neale .......................... 250/203.4 |
| 4,179,612 | A | * | 12/1979 | Smith .......................... 250/203.4 |
| 4,317,031 | A | * | 2/1982 | Findell ......................... 250/203.4 |
| 4,883,340 | A | * | 11/1989 | Dominguez .................. 359/593 |

* cited by examiner

*Primary Examiner* — Jonathan Johnson
*Assistant Examiner* — Lindsey Bernier
(74) *Attorney, Agent, or Firm* — IPCL Group PLC; Anthony Tacconi

(57) ABSTRACT

The present invention provides an apparatus and method for solar tracking. The solar tracking sensor array and method so disclosed can be used with any device that requires a specific orientation to the sun for optimal operation. The system relies upon a sun tracking mechanism which includes a plurality of phototransistors configured in a particular manner. The apparatus can further be used with an analog sensor circuit which is also disclosed herein. Although the device and method are disclosed in conjunction with a solar tracking device, which includes the analog sensor circuit, a drive assembly, and a power source, these components may be used independently of one another.

9 Claims, 4 Drawing Sheets

SOLAR TRACKING SENSOR ARRAY

This application is a divisional application from U.S. application Ser. No. 11/236,695 and claims priority from the foregoing application.

FIELD OF THE INVENTION AND RELATED ART

This invention relates to sensor devices for solar tracking. Solar power is a renewable energy source derived from the conversion of sunlight to electricity. As the 21$^{st}$ century progresses, solar power continues to play a considerable role in the future of global energy production.

As solar-based devices rely upon the collection of sunlight, all such devices must be appropriately oriented so as to maximize their operation. Generally, each device operates most efficiently at some optimal orientation, which may vary depending on the location, setting, or geometry of the collection device, at which the solar device is best positioned to collect sunlight at any given time.

Consequently, solar based devices require orientation to maximize efficiency and operation. Many installations compromise efficiency by choosing an optimal fixed orientation, but tracking installations can be used instead to provide even greater output. Various techniques exist in the art for tracking the sun. These techniques include manual manipulation by a human operator, pre-set movement based upon expected positioning of the sun, and traditional shadow bar sensing. The present invention provides advantages over the existing devices and techniques as it allows for more precise tracking while minimizing tracking error and eliminating manual intervention.

SUMMARY AND OBJECTS OF THE INVENTION

The invention discloses a novel sun tracking apparatus and method which utilizes an arrangement of phototransistors to assist in the control of a drive assembly, or similar means, in a solar tracking device. The apparatus can further be used with an analog sensor circuit which is also disclosed herein.

DETAILED DESCRIPTION OF THE PREFERRED EMBODIMENT

The primary embodiment of the invention disclosed herein focuses on a single axis tracking system. That is, the system follows the sun in the azimuth (east to west) direction throughout the day, but does not have a second axis of motion to correct for the seasonally changing zenith (vertical) angle. This is because a middle value for the zenith angle can be chosen as the fixed angle of the tracker, maintaining a low margin of error throughout the year. In other words, the azimuth tracking substantially increases the energy output (by about 28%, depending mostly on the latitude of the site), while the zenith tracking would only provide a marginal improvement at twice the cost (an additional 4% or so). However, those skilled in the art will realize that the same design principles disclosed herein could be applied to a second axis of motion if desired.

Figure 1:
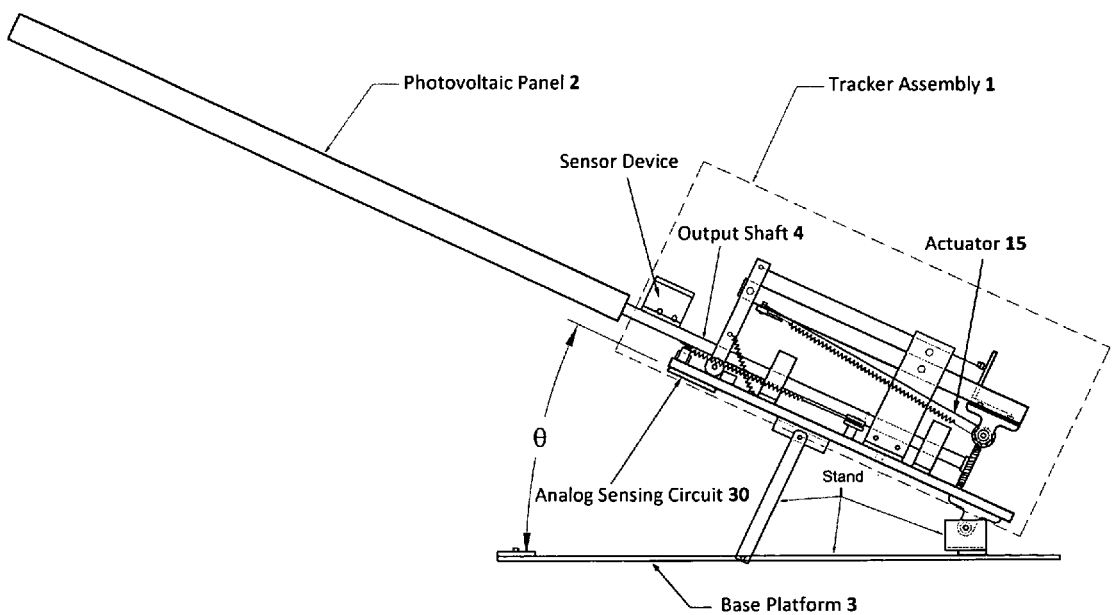
FIG. 1 is a side view of the tracker assembly with photovoltaic panel and stand.

Referring now to FIG. 1, the sensor array is shown as used in conjunction with a complete solar tracking assembly, including a drive mechanism and associated components. It will be realized that the sensor may be used independent of such an assembly if so desired. The solar tracking device may be categorized as having three primary components: a tracking assembly 1, a photovoltaic panel 2, and a base platform 3. The photovoltaic panel 2 is disposed at the end of a rotatable output shaft 4, which is designed to move in both forward and backward directions. The photovoltaic panel 2 and the tracking assembly, as a unit, are mounted on an adjustable stand that supports a base platform 3 that permits the adjustment and fixation of the zenith angle of the assembly.

Figure 2:
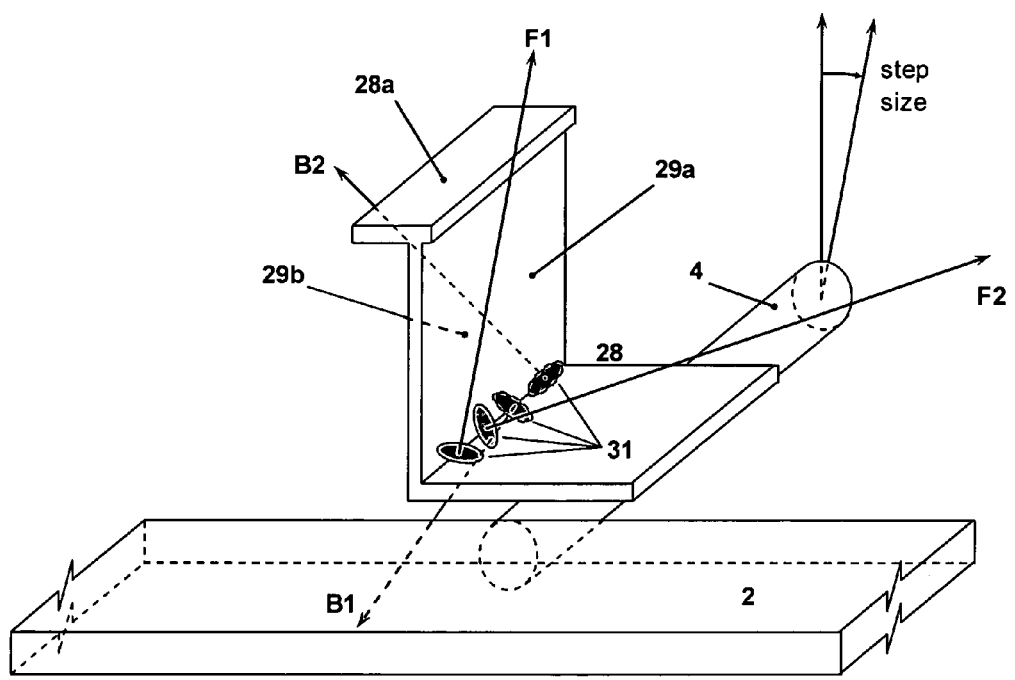
FIG. 2 is a perspective view of the sensor mount.
Figure 3:
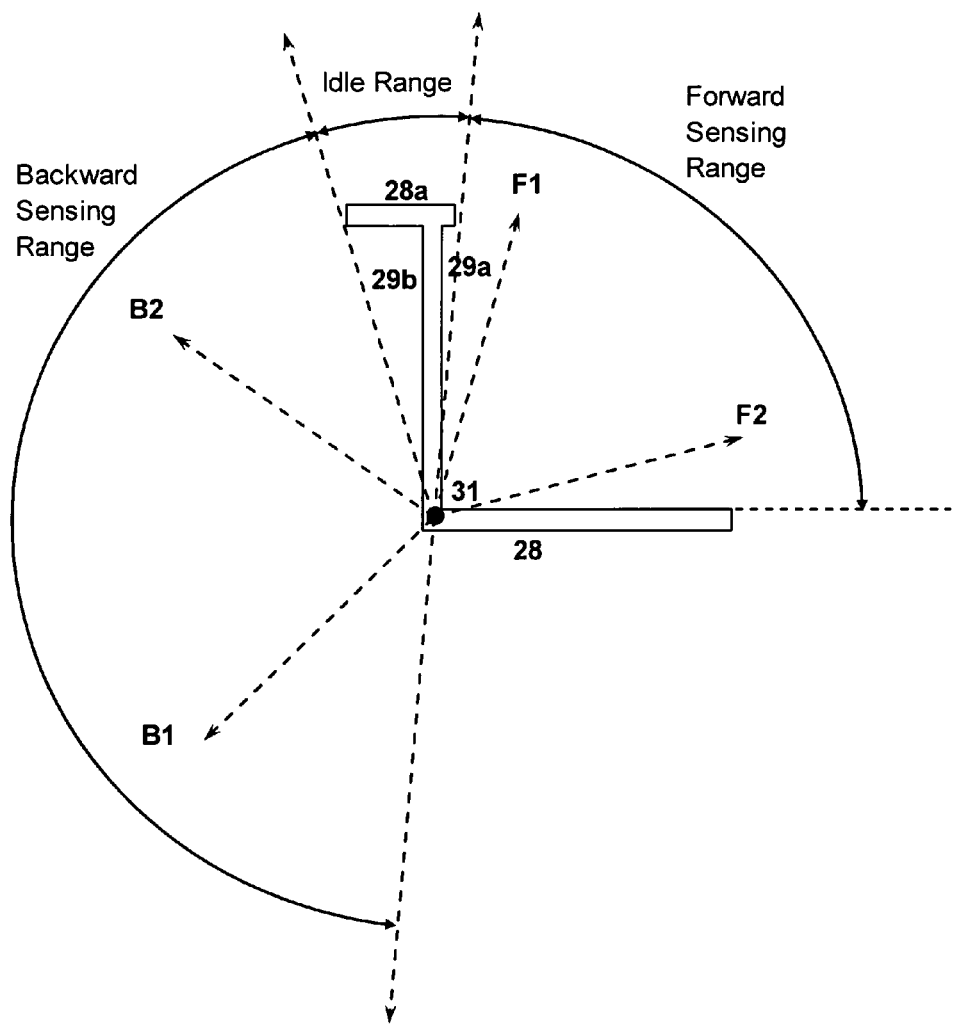
FIG. 3 is a top view of the sensor mount.

FIGS. 2 and 3 show the sensor mount 28 which consists of a shade 29a, 29b and an overhanging portion 28a. Two forward motion phototransistors, F1, F2, are mounted on one side, the forward side, of a shade 29a and two additional backward motion sensors, B1, B2 are secured on the other side, the backward side, of the shade 29b. These phototransistors are secured to a sensor mount 28 that is attached to the output shaft 4 so that it moves with the photovoltaic panel 2 throughout the day to follow the relative position of the sun. The sensor mount 28 includes an overhang portion 28a.

Figure 4:
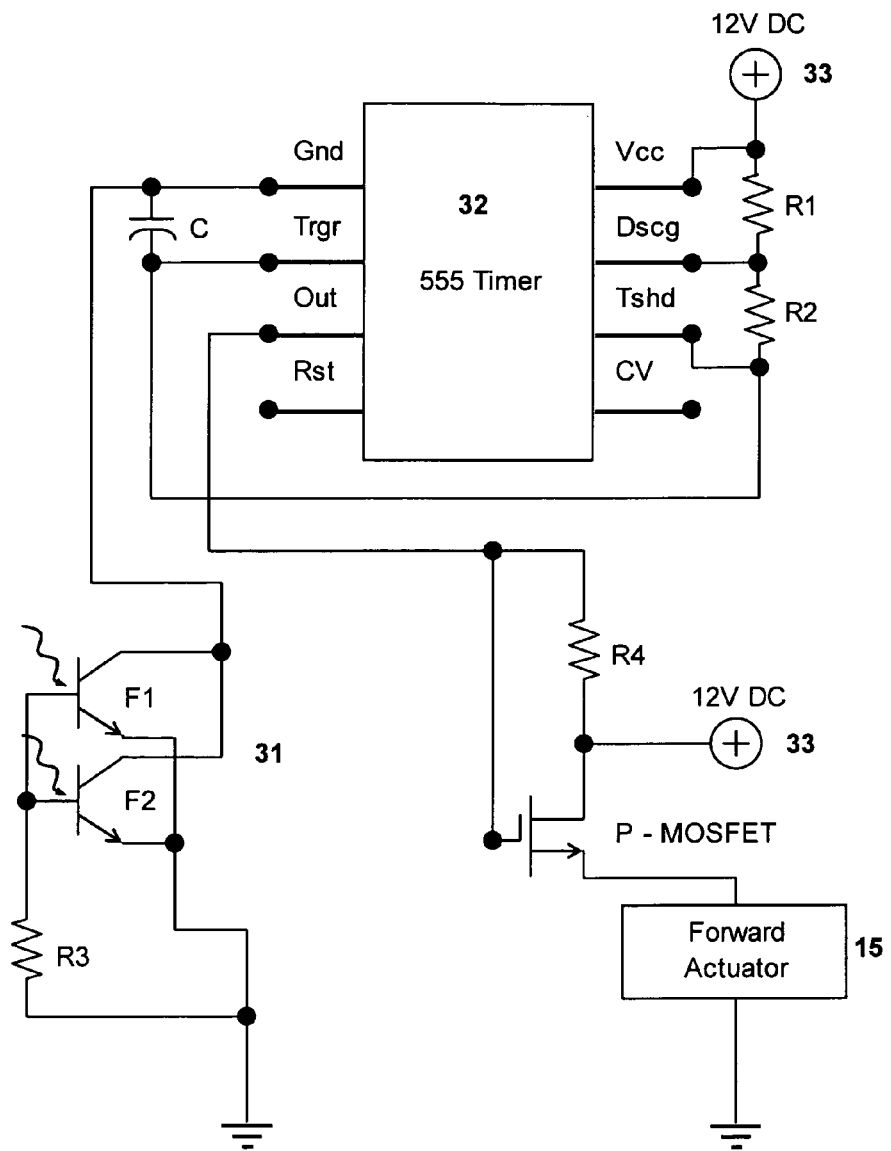
FIG. 4 is a schematic of the sensor circuit for controlling movement of the drive assembly.

The movement of the drive mechanism is controlled through the use of an analog sensing circuit 30. The drive mechanism in this case is one or more actuators, but the drive mechanism may also consist of an electric motor or any other such device. Referring now to FIG. 4, in the embodiment described herein, different phototransistors 31 are used to activate separate parts of the circuit in order to control the different directions of motion. A 555-timer 32 is provided to control another transistor, the P-MOSFET, that allows current to flow from the battery 33 to the drive assembly.

The simplest method of controlling the movement of the drive mechanism is through an analog sensing circuit 30. There must be at least one sensor for each direction of motion. In this design, different phototransistors 31 are used to turn on separate parts of the circuit 30 to control the different directions of motion. Multiple phototransistors can be used for each direction of motion by connecting them in parallel. The light-sensitivity of these phototransistors can be adjusted by changing the value of the resistor R3. Once a phototransistor activates the circuit, a 555-timer 32 controls another transistor that allows current to flow from a battery 33 to the drive assembly. The timer is used to convert a continuous "on" signal from the phototransistor to a cyclic "on-off" signal. The necessary "on-time" and "off-time" can be adjusted to the correct duration by the values of two resistors R1, R2 and one capacitor C that are connected to the timer 32. Also, the timer 32 itself receives no power without a signal from one of the phototransistors 31, because of a break in the ground line, in order to minimize overall power consumption. In this arrangement, the current is drawn from a battery 33 that has been charged by the photovoltaic panel 2, but it will be recognized that the power could also come from a photovoltaic panel directly, a bank of capacitors, an alternating current line, or any other electric power supply.

When the timer 32 is not grounded, it consumes no power, and the P-MOSFET breaks the circuit to the drive assembly, in this case the actuator 15, so that no movement can happen. If F1 or F2, or both, receive light, then the timer 32 becomes grounded and begins to count, by charging and discharging the capacitor C through R1 and R2. Once the timer 32 has completed the first period of its two-step cycle, it toggles the output signal to close the P-MOSFET, allowing current to flow from the battery 33 (or photovoltaic panel, capacitor bank, AC, or any other power supply), through the P-MOSFET, then the drive mechanism, to the ground. When the timer has finished the second period of its cycle, the output of the timer is toggled once again, so the P-MOSFET breaks the circuit. If the previous cycle did not rotate the output shaft 4 far enough, then the forward sensors will still be in the light, and the cycle continues until they are shaded. When all the sensors are shaded, the timer ground is broken so no further action is taken. The backward part of the circuit works exactly the same way. It is identical in form, but may have different values for C, R1, or R2, for timing purposes, and can have physically different sensor positions and orientations. It will be recognized by those in the art that other controller types, including digital circuits, may be used to accomplish the foregoing tasks.

The layout of the phototransistors 31 determines the way that the motor responds to the sun. The two phototransistors, F1, F2, mounted on the forward side of the shade 29a detect the sun if it is getting ahead of the plane of the photovoltaic panel 2. The other two sensors, B1, B2 are used on the backward side of the shade 29b to detect the sun if it is far behind the photovoltaic panel 2. This sensor mount 28 is oriented such that it moves with the photovoltaic panel 2 throughout the day. When the photovoltaic panel 2 is directly facing the sun, all phototransistors are shaded, so no motion is signaled (idle position). The width of the overhang structure 28a on the sensor mount 28 determines the range of the idle position. For example, if the panel 2 can be rotated in steps of four degrees then the overhang 28a should shade the forward sensors (F1, F2) until the sun is overhead by two degrees thereby minimizing tracking error.

Referring to FIGS. 5 and 6, under normal operation, the forward facing sensors (F1, F2) are triggered many times throughout the day, signaling the motor to inch along with the sun. Then at sunrise the next day, the backward facing sensors (B1, B2) will detect the rising sun and signal the tracking device to return the panel 2 to its starting position. When it is cloudy, no signal is given, and so no power is wasted trying to chase the sun when nothing but diffuse light is available in the sky, in which case the angle of the photovoltaic panel has little importance. If it is cloudy for only the beginning or end of the day, then the sun might re-appear at any point relative to the photovoltaic panel, so multiple sensors are used to cover greater angles. If the sun appears far ahead of the photovoltaic panel 2, then the motor will continue to cycle until the photovoltaic panel 2 is facing the sun, placing the forward facing sensors (F1, F2) in the shade of the sensor mount 28. If the sun appears behind the photovoltaic panel 2, then the panel can adjust backwards, or return to the starting position and then catch up to the sun within a few minutes. Nevertheless, the return motion will still happen at most once per day.

In the embodiment shown herein, the circuit is configured such that forward movement of the drive assembly is effected by heating an actuator so that the contraction causes a rotation in the drive clutch (not shown) of the drive assembly. The circuit is further configured such that the backward or reverse movement of the drive assembly is accomplished through slightly different means, in that a contraction of the actuator serves to disengage the drive assembly and the panel is returned to its starting position through the use of a return spring. It will be noted that the circuit and drive mechanism may be configured to permit backward step motion in the same fashion as it is used to permit forward motion, if such movement is desired.

While the invention has been described in reference to certain preferred embodiments, it will be readily apparent to one of ordinary skill in the art that certain modifications or variations may be made to the system without departing from the scope of invention claimed below and described in the foregoing specification.

We claim:

1. A sensor assembly device for tracking a source of radiation along a single axis comprising:
    an output shaft having an axis of rotation;
    a sensor mount having a mount portion, a shade portion, and an overhanging portion; said sensor mount being free to rotate in tandem with said output shaft;
    said shade portion being attached to and perpendicular to both said mount portion and said overhanging portion such that the mount portion and overhanging portion are parallel and, further, such that the line defined by the intersection of the shade portion and the mount portion is parallel to the axis of rotation of said output shaft; said line defined by the intersection of the shade portion and the overhanging portion also being parallel to the axis of rotation of said output shaft;
    said shade portion having two opposite sides, a forward motion receiving side and a backward motion receiving side; and
    a sensor array comprising:
    two or more forward motion sensors located on the forward motion receiving side of said shade portion; and
    two or more backward motion sensors located on the backward motion receiving side of said shade portion.

2. The sensor assembly device as in claim 1 wherein said forward motion sensors and said backward motion sensors are oriented at varying non-identical angles with respect to a source of radiation.

3. The sensor assembly device as in claim 1 wherein said two or more first forward motion sensors are phototransistors and further wherein said two or more backward sensors are phototransistors.

4. The sensor assembly device as in claim 1 wherein the dimensions of said sensor mount constrain the relative angles through which said forward motion sensors and backward motion sensors can be activated by a source of radiation.

5. The sensor assembly device as in claim 1 further comprising a sensor circuit electrically attached to said forward sensors and said backward sensors for controlling movement of a drive mechanism.

6. A sensor assembly for tracking a source of solar radiation along a single axis comprising:
    a mounting bracket capable of forward and backward rotation around an axis of rotation; said mounting bracket having a rectangular dividing shade oriented in a plane radial to the axis of rotation, a rectangular overhang shade oriented perpendicular to the dividing shade and positioned on the edge of the dividing shade that is farthest from the axis of rotation;
    said dividing shade and overhang shade defining a forward motion receiving zone and a second portion on the second side of said dividing shade defining a backward motion receiving zone; and
    a sensor array comprising at least two forward motion sensors located within the forward motion receiving zone and positioned at disparate angles; and at least two backward motion sensors located within the backward motion receiving zone at disparate angles.

7. A single-axis solar tracking sensor assembly for a solar tracking device comprising:

a bracket assembly including a mounting body having a vertical component and a horizontal component extending substantially at a right angle from said vertical component; said mounting body having an inside portion formed by the intersection of said horizontal component and said vertical component; said mounting body further having an outside portion opposite said inside portion;

an overhang structure attached to one end of said vertical component of said mounting bracket wherein the body of said overhang structure is parallel to the plane of said horizontal component of said mounting bracket; and a sensor array comprising:

at least two forward motion phototransistors mounted within said inside portion of said mounting body; and at least two backward motion phototransistors mounted within said outside portion of said mounting body, said sensor array being so configured as to define a solar sensing range;

whereby input from said sensor array can be used to effectively track a source of radiation and thereby control the direction and degree of rotation of an underlying structure in order to maintain a pre-determined alignment of said structure with respect to said source of radiation.

8. The solar tracking assembly of claim 7 further comprising said mounting body having a generally L shaped cross-sectional design.

9. The solar tracking assembly of claim 7 wherein said mounting body further includes a second vertical component projecting from said horizontal component; said mounting body having a generally U shaped cross-sectional design.

* * * * *